United States Patent [19]
Katzenstein

[11] Patent Number: 4,899,103
[45] Date of Patent: Feb. 6, 1990

[54] CURRENT METER

[75] Inventor: Henry S. Katzenstein, Pacific Palisades, Calif.

[73] Assignee: Brooktree Corporation, San Diego, Calif.

[21] Appl. No.: 74,256

[22] Filed: Jul. 16, 1987

[51] Int. Cl.⁴ .................. G01R 33/00; G01R 19/00
[52] U.S. Cl. ........................ 324/99 D; 324/117 R; 324/127; 330/8
[58] Field of Search ............. 324/126, 127, 99 D, 324/99 R, 117 R, 130; 340/657, 664; 330/8

[56] References Cited

U.S. PATENT DOCUMENTS

| | | | |
|---|---|---|---|
| 3,275,934 | 9/1966 | Laishley | 324/99 R |
| 3,422,352 | 1/1969 | Paulkovich | 323/48 |
| 3,484,691 | 11/1966 | MacMartin et al. | 324/117 |
| 3,539,908 | 11/1970 | Zelina | 323/48 |
| 3,628,251 | 12/1971 | Halder | 33/27 B |
| 3,801,907 | 4/1974 | Lilienstein | 324/117 R X |
| 3,818,337 | 6/1974 | Groenenbroom et al. | 324/127 X |
| 3,855,528 | 12/1974 | Brown | 324/117 R |
| 3,882,387 | 5/1975 | Vikstrom | 324/117 R |
| 3,955,138 | 5/1976 | Milkovic | 324/127 |
| 4,015,209 | 3/1977 | Meyer Ebrecht | 324/99 R X |
| 4,276,510 | 6/1981 | Tompkins et al. | 324/127 X |
| 4,278,938 | 7/1981 | Morriss | 324/117 R |
| 4,280,162 | 7/1981 | Tanks et al. | 324/117 R X |
| 4,298,838 | 11/1981 | Akamatsu et al. | 324/117 R X |
| 4,482,862 | 11/1984 | Leehey | 324/117 R |
| 4,495,463 | 1/1985 | Milkovic | 324/142 X |
| 4,529,931 | 7/1985 | Kuhns | 324/117 R X |
| 4,540,939 | 9/1985 | Osborne | 324/127 |
| 4,616,174 | 10/1986 | Jorgensen | 324/117 R X |
| 4,682,100 | 7/1987 | Hagelin | 324/127 X |

FOREIGN PATENT DOCUMENTS 3329737 3/1985 Fed. Rep. of Germany ...... 324/126

*Primary Examiner*—Reinhard J. Eisenzopf
*Assistant Examiner*—Vinh P. Nguyen
*Attorney, Agent, or Firm*—Ellsworth R. Roston; Charles H. Schwartz

[57] ABSTRACT

A variable electrical current in a first winding on a magnetizable core produces a magnetomotive force in the core. A second core winding produces an opposing magnetomotive force digitally adjustable periodically by a third core winding, a pair of switches and a flip-flop coupled to a center tap for alternately closing such switches when triggered to opposite states. The flip-flop is triggered between opposite states when the third winding current reaches a particular magnitude. In each cycle, the time differences for producing the particular magnitudes and the opposite polarities are dependent upon the remanent core flux. Such time differences are counted digitally upwardly and downwardly for opposite polarities. The second winding current is adjusted digitally in each cycle in a direction to minimize such count. The magnitudes of successive adjustments may be compared periodically by adaptive tracking techniques to control the magnitudes of subsequent adjustments. With large magnitudes of the variable current, the first winding on the core may receive a stepped-down current from a first winding on a second core having a second winding to receive the variable current. Windings on the first and second cores may be connected in a closed loop, or windings on a third core produce in the first core a magnetomotive force aiding the magnetomotive force from the current in the second winding on the second core to compensate for energy losses as a result of such current. The second core may be notched to prevent core becoming saturation.

74 Claims, 5 Drawing Sheets

CURRENT METER

This invention relates to apparatus for, and methods of, determining the magnitude of a variable electrical current accurately, reliably and rapidly with a minimal energy loss. The invention also relates to apparatus for, and methods of, digitally determining the magnitude of a variable electrical current. The invention further relates to apparatus for, and methods of, determining the magnitude of large electrical currents, particularly by digital techniques. The invention also relates to apparatus for compensating for energy losses in cores and windings in the apparatus in determining the magnitudes of the electrical currents.

The magnitudes of variable electrical currents have to be determined in a wide variety of different applications. For example, practically every household has a meter for determining the electrical energy consumed by the household during a measuring time period such as a month. Each such household is then billed by the power company for the consumption of energy by such household during such measuring period on the basis of the reading of the meter by an individual who works for the power company and who visits the household at the end of the measuring period to read the meter.

The magnitudes of variable electrical currents also have to be determined in industry. For example, controls are provided in industry in the operation of various types of systems on the basis of the magnitude of a variable current flowing at strategic terminals in such systems at progressive instants of time. These controls may have a diversity of effects. For example, the controls may regulate a welding current or may regulate the speed of movement of one part in the system relative to another part in the system or may control parameters such as the temperature or pressure of strategic sub-systems or components in the system.

The electrical meters now in use have certain inherent and significant disadvantages, particularly when they are used to measure a variable electrical current. For example, the meters now in use to measure the energy consumption of individual households are relatively large, bulky and expensive. They require an employee of the power company to visit the household periodically to read the meter and to record the reading. They generally have to be placed outdoors to accommodate the reader. However, this involves some invasion of privacy of the household by the reader and some danger to the reader such as by alarmed or vicious dogs, particularly when the meter is disposed in the back yard of the household.

The meters in industry also have certain inherent and significant disadvantages. They consume relatively great amounts of power. They are generally not as accurate as desired. They do not measure large magnitudes of variable current very well. They are relatively bulky and expensive. They do not respond as fast to changes in electrical current as is often desired. They cannot conveniently provide a reading at a first position and provide a control at a displaced position on the basis of the reading at the first position. They do not convert the variable electrical current directly to a digital determination.

There are other problems with the meters now in use. They do not provide accurate readings when the power factor is low such as occurs when there is a considerable phase difference between the voltage and the current. The meter is also not accurate when the harmonic content of the current is high or when there is a large component of direct current in the variable current being measured.

The desire, often even the need, to have meters with the capabilities discussed in the previous paragraphs has been known for some time, even decades. A considerable effort has been made, and significant amounts of money have been expended, by a large number of interested parties to provide meters which will meet the criteria specified above. In spite of such efforts and such expenditures of money over such extended periods of time, the meters now in use fall often far short of meeting the criteria discussed above.

In one embodiment of the invention, a closed-loop magnetizable member (e.g., core) produces a magnetomotive force representative of a variable electrical current flowing through a first winding on the core. A second winding on the core, preferably of a greater number of turns than the first winding, produces a magnetomotive force opposing the representative magnetomotive force. The current scaled by the turns ratio in the second winding may be adjusted periodically as by digital techniques. The adjusting circuitry may include a third winding having a center tap, a pair of switches each connected to an opposite terminal of such winding and a bistable flip-flop coupled to the center tap for alternately closing such switches in the opposite states of flip-flop operation.

Circuitry may alternately trigger the flip-flop from one state to the opposite state when the current in the third winding reaches a particular magnitude. The differences in the times for producing the currents with the particular magnitudes and the opposite polarities are dependent upon the remanent flux in the member. An up-down counter provides a digital count of such time differences. This digital count is used to adjust the current in the second winding in a direction to eliminate such count. The magnitudes of the successive adjustments in the current in the second winding may be compared periodically by adaptive tracking techniques to control the magnitudes of subsequent adjustments in such current.

When the magnitude of the variable electrical current is large, the first winding on the core may receive a stepped-down current from a first winding on a second magnetizable member (e.g., core), a second winding being disposed on the second core to receive the variable electrical current. Windings may be provided on a third magnetizable member (e.g., a core) to produce in the first core a magnetomotive force aiding the magnetomotive force from the current in the second winding on the second member to compensate for energy losses as a result of such current. Alternatively, windings on the first and second cores may be connected in a closed loop to produce a magnetomotive force aiding the magnetomotive force from the current in the second winding on the second member to compensate for energy losses as a result of second core may be notched to prevent it from becoming saturated by the large current flowing through the second winding on the second member.

Figure 9:
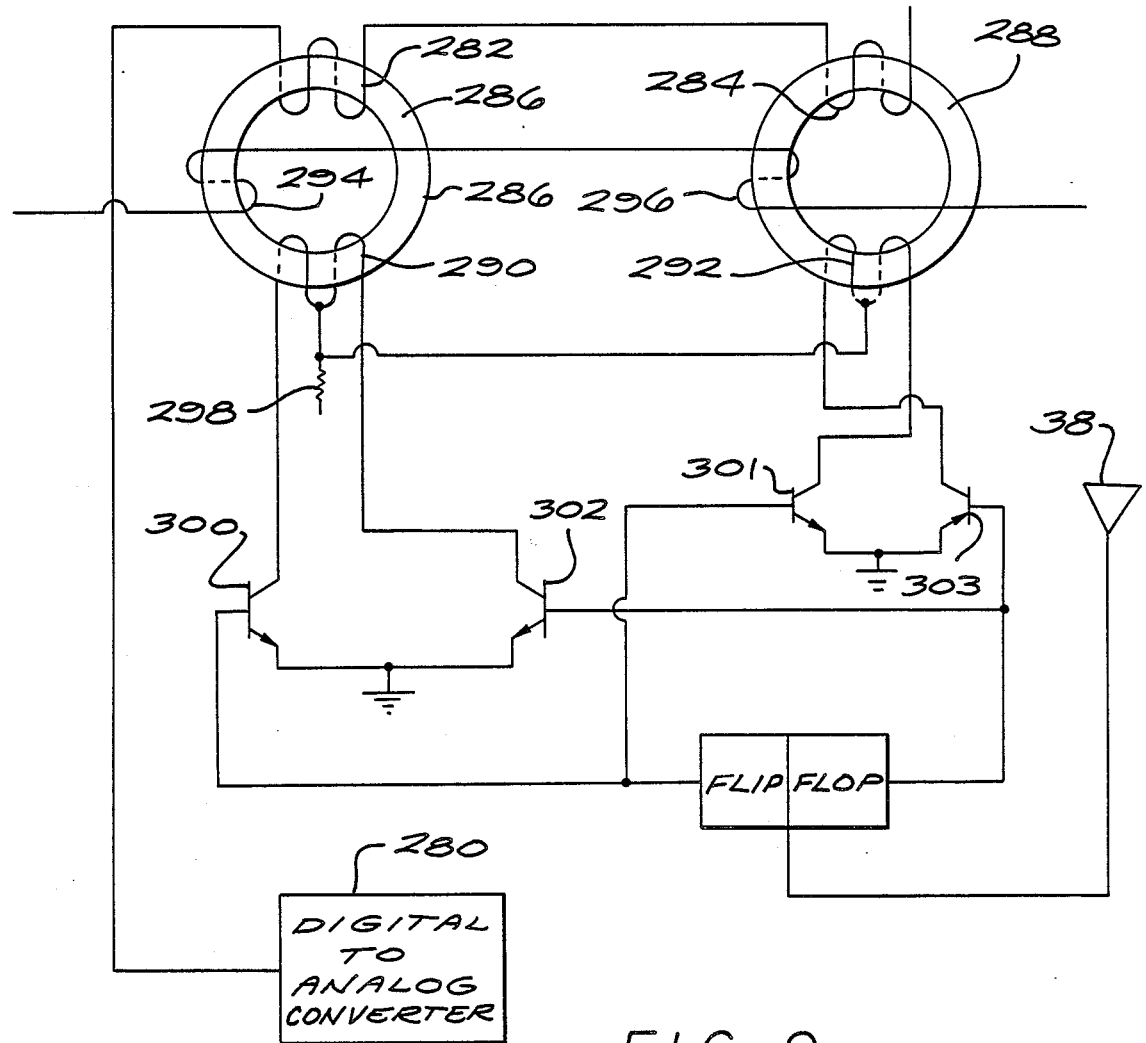
FIG. 9 is a schematic diagram of still another embodiment of the invention for simplifying the operation of the system in determining the magnitude of a variable electrical current.
Figure 10:
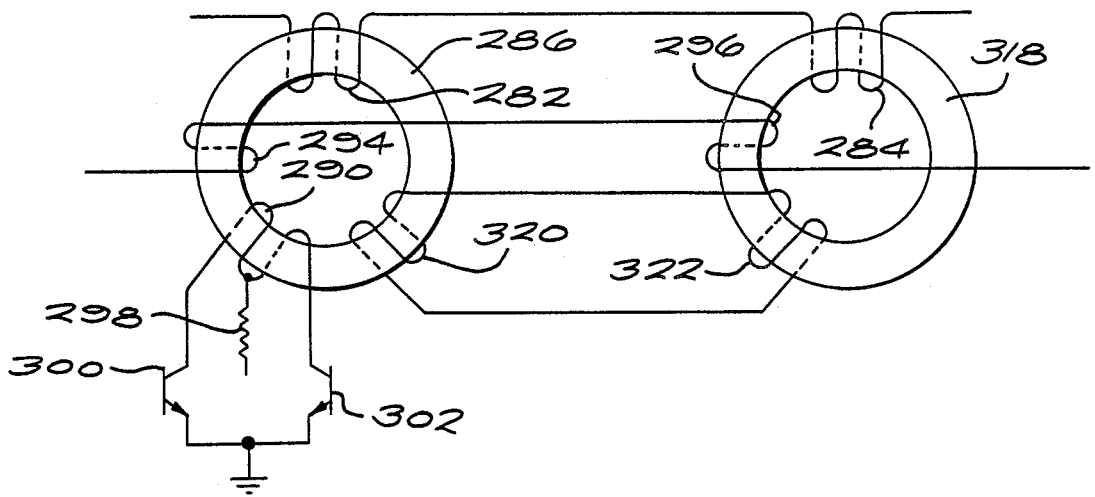
Figure 11:
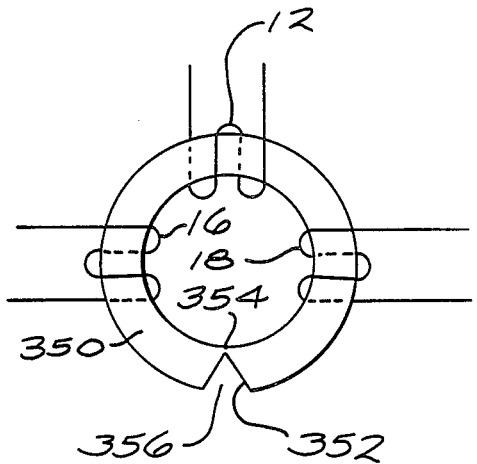

FIG. 10 is a schematic view illustrating an improvement which may be incorporated in the embodiments shown in the previous Figures to accomplish the same functions as the embodiment shown in FIG. 9 but on a simplified basis relative to the embodiment shown in FIG. 9; and FIG. 11 is an additional embodiment of the invention for preventing the toroidal core from becoming saturated by large magnitudes of the variable electrical current.

Figure 1:
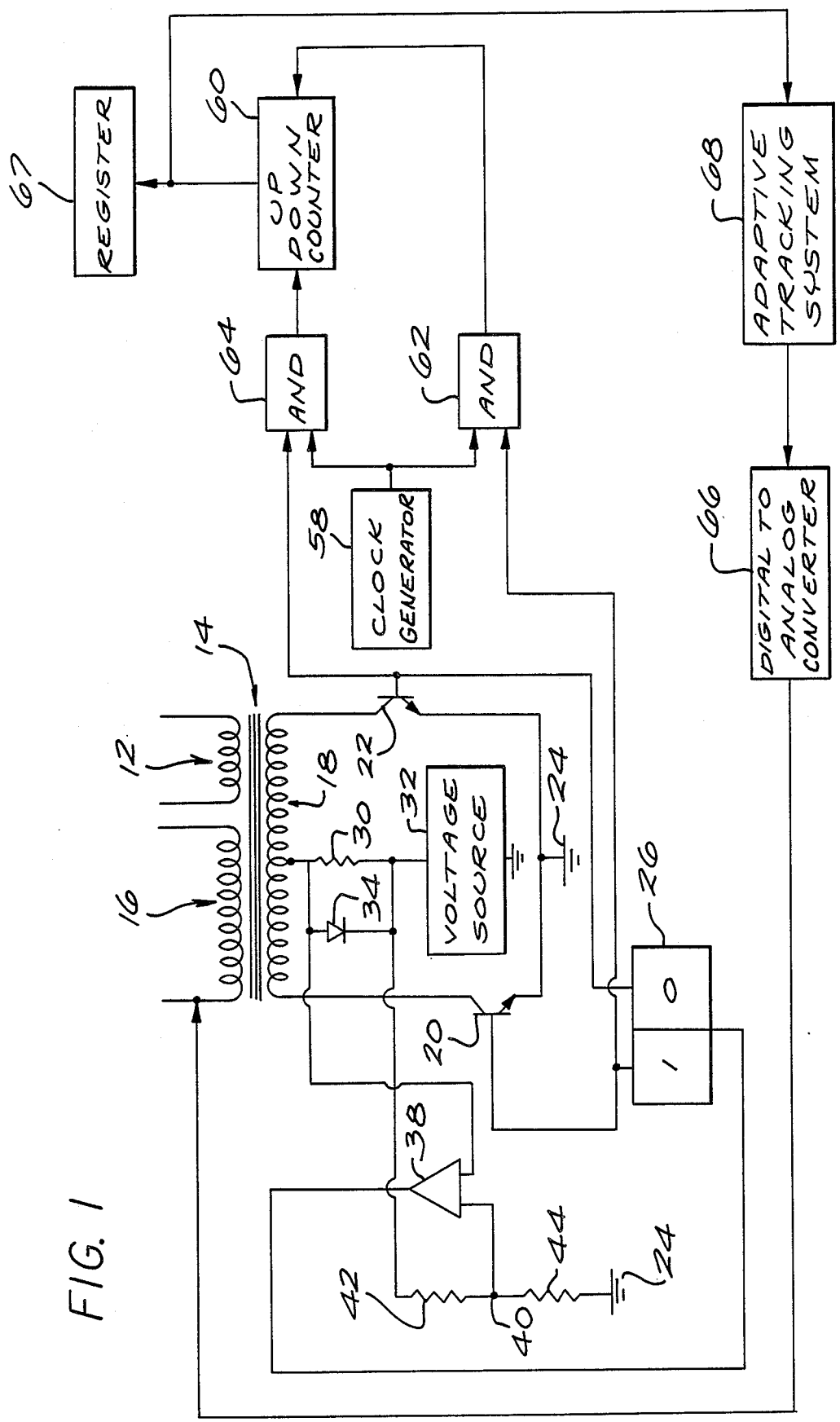
FIG. 1 is a schematic circuit diagram of one embodiment of the invention for indicating the magnitude of a variable electrical current.
Figure 2:
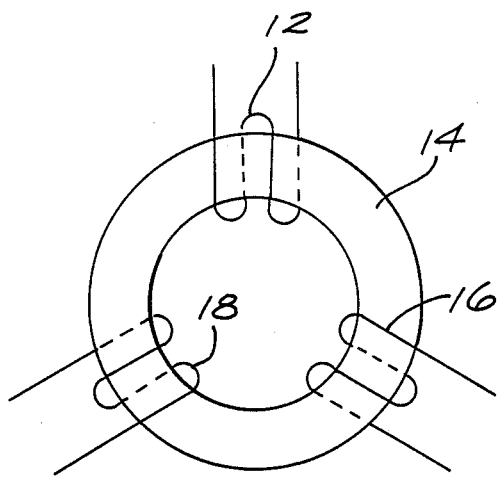
FIG. 2 is a schematic diagram illustrating a toroidal core and the disposition on the core of windings such as shown in FIG. 1.

In one embodiment of the invention, a system is generally indicated at 10 in FIG. 1 for determining the magnitude of a variable electrical current at progressive instants of time. The system 10 includes a winding 12 (FIGS. 1 and 2) for receiving the electrical current. The winding 12 may be disposed in magnetically coupled relationship to a magnetizable member 14, which is preferably disposed in a closed loop. The member 14 may be made from a suitable material such as a ferrite to have saturable characteristics. The winding 12 is preferably wound on the member 14.

A winding 16 (FIGS. 1 and 2) is also disposed in magnetically coupled relationship to the magnetizable member 14. Preferably the winding 16 is wound on the member 14. The winding 16 is magnetically coupled to the member 14 to produce a magnetomotive force in the member 14 in an opposite direction to that produced by the winding 12 when current flows through the windings 12 and 16.

A winding 18 (FIGS. 1 and 2), preferably center-tapped, is also magnetically coupled to the member 14. Preferably the winding 18 is wound on the member 14. The opposite end terminals of the winding 18 are respectively connected to the collectors of transistors 20 and 22 (FIG. 1), both of which may be of the N channel type. It will be appreciated that other types of switching means may be used instead of the transistors 20 and 22 without deporting from the scope of the invention.

The emitters of the transistors 20 and 22 may receive a reference potential such as a ground 24. The gates of the transistors 20 and 22 (constituting the control electrodes of the switches) are connected to the opposite output terminals of a bistable member such as a flip-flop 26 having two states of operation.

In the embodiment of FIG. 1, the center tap of the winding 18 receives a positive voltage through a resistance 30 from a voltage source 32. The anode of a diode 34 is common with the center tap of the winding 18 and the cathode of the diode 34 receives the positive voltage from the source 32. A comparator 38 produces an output voltage in accordance with the introduction of voltages to its input terminals from the center tap of the winding 18 and from a terminal 40. The terminal 40 is common to a pair of resistances 42 and 44 in series between the voltage source 32 and the reference potential such as the ground 24.

Figure 3:
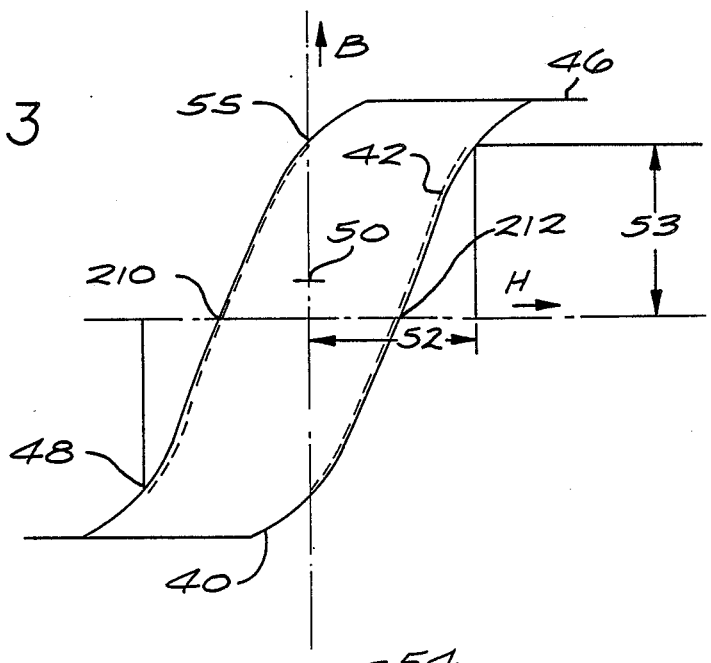
FIG. 3 is a graphical illustration of a curve showing a typical magnetic response in the toroidal core of FIG. 2 when different polarities and magnitudes of current are applied to one of the windings on the core.

FIG. 3 illustrates the magnitude and polarization of the magnetic flux in the magnetizable member 14 for different magnitudes and polarities of currents in the windings 12 and 16. Specifically, in FIG. 3, the current is shown along the horizontal axis and the magnitude and polarity of the flux are shown along the vertical axis. The curve shown in FIG. 3 is well known in the art.

With progressive increases in a positive direction in the difference in the currents through the windings 12 and 16, the flux excitation in the member 14 tends to approach saturation as indicated at 46 in FIG. 3. Similarly, the flux excitation in the member 14 tends to approach saturation in a negative direction when the polarity of the difference in the current in the windings 12 and 16 is negative and the magnitude of this current increases in a negative direction. This nearly saturated flux is indicated at 48 in FIG. 3.

At times, a remanent flux such as that indicated at 50 in FIG. 3 may exist in the member 14 even when no current flows in the winding 12. If a constant current flows through the winding 12, the amount of time required to reach the flux level 46 in the member 14 is reduced in comparison to the amount of time to reach such flux level when there is no remanent flux in the member 14. Similarly, when there is remanent flux 50 in the core 14, the amount of time required to reach the flux level 48 with a given applied voltage increases relative to the amount of time required to reach such flux level when there is no remanent flux in the core. The relative times for the current to flow in order to produce the flux levels 46 and 48 in the member 14 provide an indication of the magnitude of the remanent flux 50 in the member 14. This principle is used in a modified form in the operation of this invention.

As previously described, the variable current through the winding 12 produces a magnetomotive force in the member 14. This magnetizing force is opposite to the magnetomotive force produced in the member 14 by the current in the winding 16. The remaining circuitry in FIG. 1 is operative to maintain the flux excitation in the member 14 at a zero level by maintaining at each instant the magnetomotive force produced in the member by the current in the winding 16 at the level of the magnetomotive flux produced by the current in the winding 12.

At a particular instant of time, the flip-flop 26 may be operative so that a high voltage is produced at the output terminal of the left stage in FIG. 1 and a low voltage is produced at the output terminal of the right stage in FIG. 1. This causes a relatively high voltage to be introduced to the gate of the transistor 20 to make the transistor conductive. As a result, current flows through a circuit including the voltage source 32, the resistance 30, the left half of the winding 18, the transistor 20 and the ground 24.

As the current flows through the left half of the winding 18, it causes the level of the magnetic flux in the magnetizable member 14 to change, as shown in FIG. 3 and as described above. For example, the current in the winding 18 may be considered to be positive and the magnitude of the flux in the member 14 may be considered to be increasing in a positive direction. If the current flowing through the left half of the winding 18 increases sufficiently, the flux excitation in the member 14 tends to approach saturation, as illustrated at 46 in FIG. 3.

The increase in current through the winding 18 causes the voltage drop across the resistance 30 to increase and the voltage introduced from the center tap of the winding to the comparator 38 to decrease. This voltage is compared in the comparator 38 with the voltage produced at the terminal 40 by the voltage divider defined by the resistances 42 and 44. The voltage on the terminal 40 is set at a value corresponding to that indicated by a current 52 in FIG. 3. This current produces in the member 16 a magnetic flux excitation 53 approaching, but not equal to, a saturation of the member 14.

When the voltage on the center tap of the winding 18 equals the voltage on the terminal 40, a signal passes through the comparator 38. This signal triggers the flip-flop 26 to its opposite state of operation. This causes a high voltage to be produced on the right output terminal of the flip-flop 26 and a low voltage to be produced on the left output terminal of the flip-flop. As a result, the transistor 22 becomes conductive and the transistor 20 becomes non-conductive.

As the transistor 20 becomes non-conductive, the current previously flowing through the transistor begins to decay, thereby producing a reversal in the voltage drop through the winding 18. The polarity of this reversal is such that the diode 34 is forward biased. This causes current to flow into the voltage source 32 through a circuit including the winding 18, the diode 34, the voltage source 32 and the transistor 22. This current returns to the voltage source 32 most of the energy drawn from the voltage source when the transistor 20 was conducting. This action continues until the current flow through the winding 18 is zero. This corresponds to the point 55 on the B-H curve in FIG. 3.

Current then flows through a circuit including the winding 18, the resistance 30, the right half of the winding 18 and the transistor 22. The rate of build-up in the flow of this current is dependent upon the difference between the voltage from the source 32 and the back electromotive force in the winding 18 and upon the value of the resistance 30. As saturation, as at 48 (FIG. 3), is approached in the core 14 in the negative direction, the comparator 38 again supplies a signal to the flip-flop 26. This signal again causes the state of conductivity of the switches represented by the transistor 20 and 22 to become reversed. As a result, the transistor 20 becomes conductive and the transistor 22 becomes non-conductive.

The flow of current through the right half of the winding 18 causes the flux produced in the member 14 in the previous half cycle to be initially neutralized. The flux in the member 14 then accumulates in an opposite polarity until the current flowing through the resistance 30 and the winding 18 reaches a particular magnitude in the negative direction corresponding to the magnitude 53 in the positive direction. At this particular magnitude in the negative direction, the voltage introduced to the comparator 38 from the center tap of the winding 18 becomes equal to the voltage on the terminal 40. This causes the comparator 38 to pass a signal to the flip-flop 26 to trigger the flip-flop to its original state of operation. In this way, current starts to flow again through a circuit including the voltage source 32, the resistance 30, the left half of the winding 18 and the switch 20.

When the net magnetization produced by the windings 12 and 16 in the magnetizable member 14 is zero, the flip-flop operates for the same period of time in its two stable states. Assume now, however, that the windings 12 and 16 produce the net flux 50 in the magnetizable member 14 and that this results from a greater production of flux excitation in the member 14 by the winding 12 than by the winding 16. As a result, a decreased amount of time is required for the winding 18 to produce the magnitude 53 of flux excitation in the member 14 when the magnetomotive force produced by the flow of current through the winding 16 is in the direction of the net flux 50 than the corresponding magnitude of flux excitation produced by the flow of current through the winding 16 in the opposite direction.

Because of the unbalance in time as discussed in the previous paragraph, the flip-flop 26 operates longer in one state than in the other. The magnitude of this unbalance is indicative of the magnitude of the net flux 50 in the member 14. It will be appreciated that the unbalance in the bistable operation of the flip-flop 26 is in one direction for a positive net flux in the member 14 and is in the opposite direction for a negative net flux in the member.

Figure 4A:
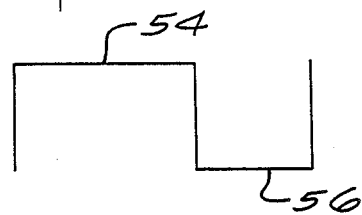
FIGS. 4a and 4b are schematic representations of the operation of a bistable flip-flop in the circuitry of FIG. 1 in unbalanced relationships when remananent flux exists in the toroidal core shown in FIG. 2.
Figure 4B:

FIG. 4(a) illustrates the states of operation of the flip-flop 26 when voltage is impressed on the left half of the winding 18 (54 in FIG. 4a) for a longer period of time than the right half of the winding (56 in FIG. 4a). During the periods 54 and 56, clock signals are produced periodically by a clock generator 58 (FIG. 1). When the bistable flip-flop 26 operates at a frequency such as approximately one hundred kilohertz (100 KHz), the clock generator 58 may produce signals at a suitable frequency such as five megahertz (5 mHz). The operation of the flip-flop 26 at this relatively high frequency is facilitated by the operation of the diode 32 in expediting the reversal of flux in the winding 18. In like manner, FIG. 4(b) illustrates the states of operation of the flip-flop 26 when the current flows through the left half of the winding 16 (57 in FIG. 4b) for a shorter period of time than the current through the right half of the winding (59 in FIG. 4b).

An up-down counter 60 is provided in FIG. 1 to count the clock signals during the production of the time periods 54 and 56 (or 57 and 59) in each cycle of the signals produced by the flip-flop 26. The counter 60 may be constructed in a conventional manner. During the period 54 (or 57), the counter 60 may be constructed to count upwardly. During the period 56 (or 59), the counter 60 may be constructed to count downwardly. The polarity of the count in the counter 60 at the end of each cycle of operation of the flip-flop 26 indicates the polarity of the net flux in the member 14, and the magnitude of the count at the end of such cycle indicates the magnitude of the net flux in the member 14.

The counter 60 receives signals from the output terminals of "and" networks 62 and 64 in FIG. 1. Input terminals of the "and" network 62 receive signals from the clock generator 58 and from the output terminal of the left stage in the flip-flop 26. Input terminals of the "and" network 64 are connected to the clock generator 58 and the output terminal of the right stage in the flip-flop 26. In this way, the "and" network 62 passes the clock signals from the generator 58 when the voltage on the output terminal of the left stage in the flip-flop 26 is high, and the "and" network 64 passes the clock signals during the production of a high voltage on the right output terminal of the flip-flop 26.

The count in the up-down counter 60 in each cycle of the counter operation is introduced to a register 67 in FIG. 1. The register operates to provide a digital accumulation of the count in the counter 60 in the successive cycles of operation of the flip-flop 26. Since the count in the counter 60 in each cycle of operation represents the correction which must be made in the magnetomotive force to produce a zero remanent flux in the core 14, the accumulation of such count in the register 67 in the successive cycles of operation provides a digital indication of the cumulative value of the variable electrical current introduced to the winding 12.

The count in the counter 60 at the end of each cycle of operation of may be converted to an analog value as by a digital-to-analog converter 66. Preferably, the converter 66 is monotonic and is operative on an instantaneous basis to convert the digital indications to an analog value. Preferably, the converter 66 provides an instantaneous conversion of a large number of binary bits (such as sixteen (16)) so that the conversion is very accurate. Such a conversion is disclosed and claimed in application Ser. No. 724,829 filed by me on Apr. 19, 1985, for "Apparatus for Converting Data Between Analog and Digital Values" and assigned of record to the assignee of record of this application. The analog value from the converter 66 is used to vary the current in the winding 16 in a direction to nullify the net (or remanent) flux excitation n the magnetizable member 14. By nullifying the net (or remanent) flux excitation in the member 14 at each instant, the winding 16 produces a current indicative of the electrical current in the winding 12 at that instant.

The adjustment of the current in the winding 16 may be provided at each instant by adaptive tracking techniques. The use of such adaptive tracking techniques insures that the current in the winding 16 will accurately track the current in the winding 12. One such adaptive tracking is indicated in FIG. 1 by a stage 68 which is shown as being connected between the counter 60 and the digital-to-analog converter 66 in FIG. 1.

Figure 5:
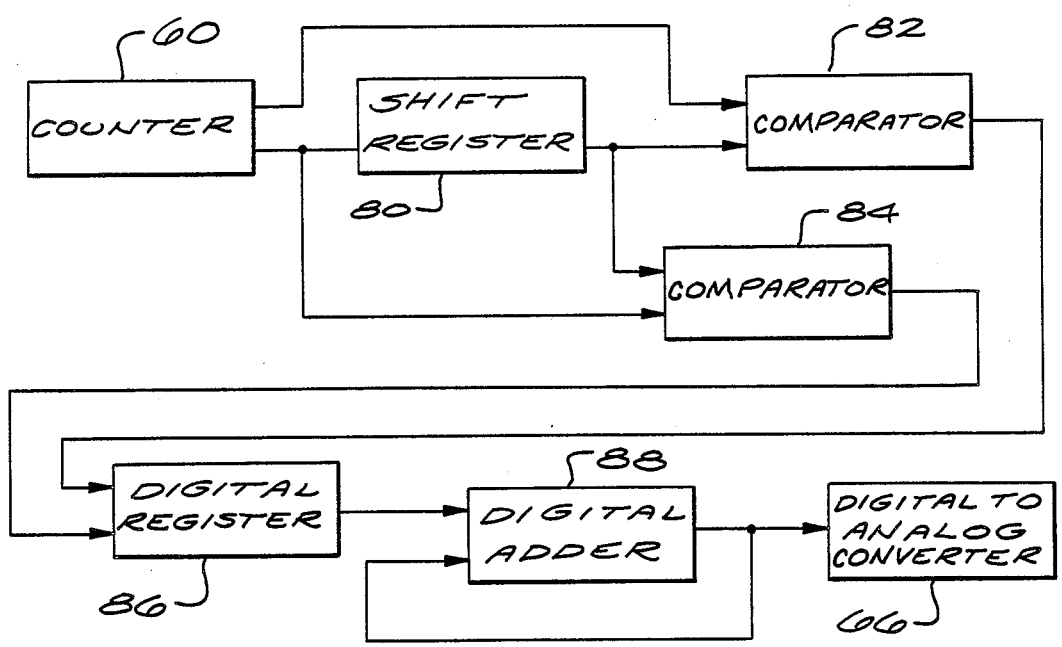
FIG. 5 is a schematic diagram illustrating improvements for introducing adaptive tracking techniques to the system shown in FIG. 1.

FIG. 5 illustrates a system in block diagram for use as the adaptive tracking stage 68 in FIG. 1. However, other adaptive tracking systems than that shown in FIG. 5 may be used without departing from the scope of the invention. The system shown in FIG. 5 includes the counter 60 and the digital-to-analog converter 66. The signals from the counter 60 are introduced to a shift register 80 and to first input terminals of comparators 82 and 84. The signals from the shift register 80 also pass to second input terminals of the comparators 82 and 84. Output signals from the comparators 82 and 84 are introduced to a digital register 86. The output signals from the digital register 86 pass to input terminals of a digital adder 88, other input terminals of which receive signals from the output terminal of the digital adder 88. The output signals from the adder 88 are introduced to the converter 66.

Figure 8:
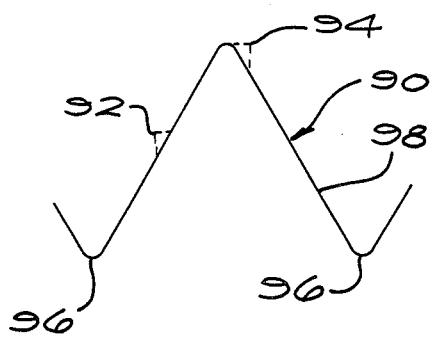
FIG. 8 is a schematic diagram of a sinusoidal waveform with digital increments inposed upon the waveform, to facilitate an understanding of the adaptive tracking circuitry shown in FIG. 5.

FIG. 8 illustrates a sinusoidal waveform generally indicated at 90. Such a waveform may be provided for the variable electrical current introduced to the winding 12 in FIG. 1. As will be seen from different increments in FIG. 9, the magnitude of the sinusoidal waveform changes most rapidly as the waveform crosses the zero axis. This may be seen from an increment 92 at the time at which the waveform 90 crosses the zero axis. In contrast, there is hardly any increment in the magnitude of the waveform 90 as the waveform reaches its peak. This may be seen from an increment 94 in FIG. 9. As will be appreciated, the increments 92 and 94 occur in increments of time having the same magnitude.

Since the magnitude of the waveform 90 changes at a very rapid rate in the period of time during which the waveform 90 crosses the zero axis, it may be difficult for the circuitry shown in FIG. 1 to increment the current in the winding 16 at such times so that the current in the winding 16 will track the current in the winding 12. The circuitry shown in FIG. 5 may accordingly be included to boost the output from the converter 66 by a maximum amount during the period of time that the waveform 90 is crossing the zero axis and to boost the output from the converter 66 by decreasing amounts as the waveform 90 approaches its peak.

In the embodiment shown in FIG. 5, the signals from the counter 60 are introduced to the shift register 80. The shift register 80 operates to delay the signals from the counter 60 by a period of time corresponding to the time of operation of the bistable stage 26 in FIG. 1 through one cycle of operation. The signals from the counter 60 and the shift register 80 in two (2) successive cycles of operation of the flip-flop 26 are then simultaneously introduced to the comparator 82 and the comparator 84.

The comparators 82 and 84 compare the outputs of the counter 60 in the two (2) successive cycles of operation of the bistable stage 26 (FIG. 1). When the output from the counter 60 in one (1) cycle of operation of the bistable stage 26 is greater than the output from the counter 60 in the immediately preceding cycle of operation of the bistable stage 26, the comparator 82 introduces a signal to the digital register 86. This causes the previous output from the register 86 to increase by an integer. For example, if the previous output from the register 86 comprises six (6) binary bits, a signal from the comparator 82 will cause the output from the register 82 to become seven (7) binary bits. As a practical matter, this causes the value of the output from the register 86 to double. The output from the register 86 is added in the adder 88 with the output from the adder in the previous cycle of operation of the flip-flop 26. The sum from the adder 88 is introduced in binary form to the converter 66 for use in incrementing the current passing through the winding 16.

In like manner, the comparator 84 produces an output signal when the output from the counter 60 in one (1) cycle of operation of the bistable stage 26 is less than the output from the counter 60 in the immediately preceding cycle of operation of the bistable stage 26. The signal from the comparator 84 is introduced to the digital register 86. This causes the previous output from the register 86 to decrease by an integer. For example, if the previous output from the register 86 comprises six (6) binary bits, a signal from the comparator 82 will cause the output from the register 86 to become five (5) binary bits. This causes the value of the output from the register 86 to become halved. This output is added in the adder 88 with the output from the adder in the previous cycle of operation of the flip-flop 26. The resultant output from the converter 66 is used to change the current in the winding 16 in a direction so that the current in the winding 16 will track the current in the winding 12.

As will be seen from the above discussion, the output of the register 86 is at a value of zero (0) when the waveform 90 is at a negative peak 96 in FIG. 8. The output from the register 86 then progressively increases with time until the waveform 90 crosses the zero (0) axis as represented by the increment 92 in FIG. 8. The output from the register 86 then progressively decreases until the waveform 90 reaches a positive peak as indicated by the increment 94 in FIG. 8. At the increment 94, the output from the register 86 is actually zero. The count in the register 86 then increases progressively to a maximum value as the waveform 90 reaches the zero (0) crossover 98 in FIG. 8 from a positive value. The indications in the register 86 then progressively decrease to a value of zero (0) as the waveform progresses in a negative direction from the zero (0) crossover to the negative peak 96.

Figure 6:
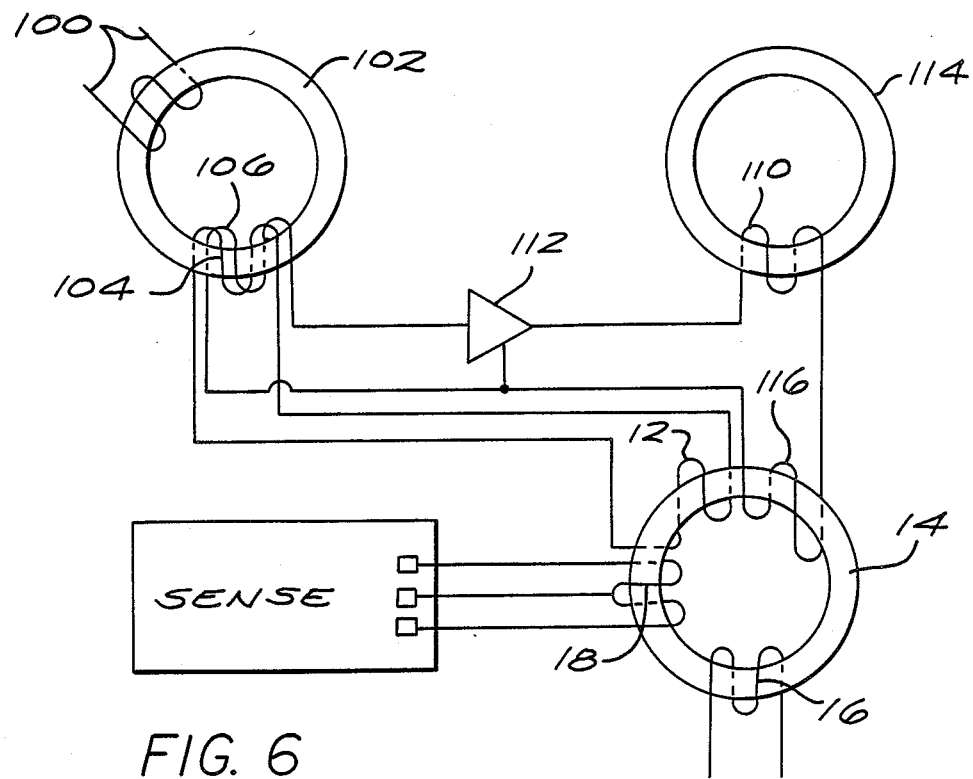
FIG. 6 is a schematic diagram illustrating other improvements in the system shown in FIG. 1 for measuring a variable electrical current of large magnitude and for compensating for energy losses produced in the system by such current of large magnitude.

FIG. 6 schematically illustrates a system for providing an indication by the winding 16 of variable electrical currents of high amplitude. For example, these variable electrical currents may be in the range of approximately one thousand (1000) amperes. The system shown in FIG. 6 includes the windings 12, 16 and 18 and the circuitry shown in FIG. 1 (this circuitry being indicated in FIG. 6 by a stage designated as "Sense"). However, the system shown in FIG. 6 includes other members to provide a manageable current in the winding 16 with a manageable number of turns in the winding. Without these additional members, the number of turns of the winding 16 might have to be increased to such a high value (e.g., 1000) that the turns could not be easily disposed on the associated core or the size of the winding might have to be so small as to make the winding unreliable in operation.

In the embodiment shown in FIG. 6, the winding 12 is connected to a winding 106 disposed on a magnetizable member 102. The magnetizable member 102 may be made from substantially the same material as the member 14 in FIG. 1 and may be disposed in a closed loop in substantially the same manner as the member 14 in FIG. 1 so as to form a toroid. A winding 100 is connected to receive the variable electrical current whose magnitude is to be determined at each instant. The winding 100 is magnetically coupled to the magnitizable member 102. A winding 104 is also magnetically coupled to the magnetizable member 102. The number of turns on the winding 104 may be greater by a particular number, such as one hundred (100), than the number of turns on the winding 100.

The winding 106 may be wound on the member 102 in a bifilar relationship with the winding 104 and may be provided with the same number of turns as the winding 104. The windings 104 and 106 may also be formed from the same wire. This causes the winding 106 to have substantially the same induced electromotive force as the winding 104. The winding 106 is connected in a circuit with a winding 110. This circuit includes an amplifier 112 having a gain of unity. The amplifier 112 has an input terminal connected to one terminal of the winding 106 and has an output terminal connected to one terminal of the winding 110. The second terminals of the windings 106 and 110 have a common connection.

The winding 110 is provided with exactly the same number of turns as the winding 106 and is formed from substantially the same wire as the winding 106. The winding 110 is disposed on a magnetizable member 114 having substantially the same characteristics as the member 102. One terminal of the winding 110 is connected to a terminal of a winding 116 which is magnetically coupled to the member 14. The other terminal of the winding 116 is connected to the amplifier 112.

The current to be measured flows through the winding 100 and produces a flux at each instant in the member 102. This flux causes a voltage to be induced in the windings 104 and 106. Since the windings 104 and 106 are substantially identical because of their bifilar relationship and their substantially identical construction, the voltages induced in these windings are substantially identical. The voltage in the winding 104 is introduced to the winding 12 to produce a flow of current through the winding 12.

Since the winding 104 and the winding 12 are connected in an electrical circuit and the winding 12 has a very low resistance, the current flow in the winding 104 tends to oppose the magnetization produced by the current flow in the winding 100. This reduces the flux in the core 102, and therefore the induced electromotive force, to a value just sufficient to overcome the drop in voltage resulting from the electrical resistances in the windings 104 and 12.

If the electrical resistance of the windings 104 and 12 were actually zero, the electromotive force produced by the current in all of the winding on the core 102 would be zero (0) and the flux in the core 102 would be zero. Under such circumstances, the current in the winding 12 would bear an exact relationship to the current in the winding 100 but would be reduced in magnitude relative to the current in the windings 100. This reduction would correspond to the turns ratio between the windings 100 and 104.

With finite electrical resistance in the windings 104 and 12, the magnetomotive force in the core 102 has a small value depending upon the values of these electrical resistances. This causes the core 102 to have a remanent flux of a small value. The magnetizing current sufficient to produce an opposing flux of such small value and to overcome other losses such as eddy current losses in the core 102 is not available to the winding 104. Therefore, the ratio of the current in the winding 12 to the current in the winding 100 is not exact but can deviate as high as several percent from the ideal value. This is the well-known ratio error of common current transformers.

For example, if the winding 104 has one hundred (100) turns and the winding 100 has one (1) turn, the current flowing in the windings 104 and 12 is almost one hundred (100) times smaller than the current flowing in the winding 100. However, it will be appreciated that different turns ratios may be adopted for the various windings such as the windings 100 and 104 than those discussed above. In this way, the windings associated with the magnetizable member 14 can respond to currents with low magnitudes even though the input current to the winding 100 may have large magnitudes such as in the ampere range. However, the response is subject to an error as high as several percent, as discussed in the previous paragraph.

The losses described above may cause the determination of the electrical current in the winding 16 to be low by as much as one percent (1%) or two percent (2%). When electrical energy is being measured, an error as high as two percent (2%) in the determination of an electrical current amounts to an error as high as four percent (4%) in the determination of electrical energy. Furthermore, when the electrical current is determined for the purpose of providing controls in electrical industry, an error as high as two percent (2%) in providing such controls is often not tolerable.

The same voltage is induced in the winding 106 as in the winding 104 because the windings 104 and 106 are bifilar and have the same characteristics. This voltage is introduced to the amplifier 112 which has a low output impedance and a gain of unity. The voltage induced in the winding 106 is accordingly repeated in the amplifier 112. The voltage from the amplifier 112 is in turn applied to the winding 110 on the core 114.

The winding 110 has the same characteristics as the winding 104 and the core 114 matches in characteristics the core 102. As a result, a current flows through the winding 110 with characteristics equal to the current which was lost by energy losses in the resistances of the windings 104 and 12 and in the core 102. This current also flows through the winding 116 on the core 14.

Since the winding 116 has the same number of turns as the winding 12, the additional ampere-turns provided by the winding 116 will compensate for the current missing from the winding 12 as a result of the energy losses in the windings 104 and 12 and in the core 102. As will appreciated, the current producing such ampere-turns is relatively low. This means that the power output from the amplifier 112 is relatively low.

Since the winding 116 is wound on the member 14 in a direction to produce flux aiding the flux produced by the current in the winding 12, the total amount of flux produced in the member 14 by the currents through the windings 12 and 116 is accurately representative at each instant of the current in the winding 100 at that instant. As a result, the magnitude of the current produced in the winding 16 at each instant accurately indicates the current passing through the winding 100 at that instant. Actually, the winding 116 may not only compensate primarily for energy losses in the member 102 but also secondarily for energy losses in the members 114 and 114.

The system shown in the drawings and described above has certain important advantages. It accurately indicates the magnitude of an unknown and variable electrical current at each instant with a considerable accuracy. This accuracy is significantly greater than the accuracies obtained by the current meters of the prior art. The system of this invention attains this accuracy without any moving parts. It attains this accuracy in a digital form which can be easily accumulated in the register 67 in FIG. 1 and which can be easily transmitted to a central station. At the control station, the digital indications of current can be converted to an analog value or digitally integrated at the central station to provide an indication of energy consumption.

The system of this invention provides an indication of a variable electrical current with a minimal number of components, all of which can be conventional and all of which can be manufactured inexpensively and reliably in high volume. As a result, the system of this invention can be supplied to customers inexpensively and can be expected to operate accurately and reliably for extended periods of time with no maintenance or repairs. This is important when the system of this invention is used to measure energy, such as in households, or is used to provide servo controls as in industry.

As will be appreciated, the indications provided by the winding 16 of the electrical current in the winding 12 in FIG. 1 (or the winding 100 in FIG. 6) are analog. However, the count in the counter 60 is digital. Furthermore, these digital indications are produced directly without first having to be converted from an analog indication by an analog-to-digital converter. These digital counts are accumulated over a period of time in the register 67 to provide an indication of the electrical current in the winding 12. The accumulated count in the register 67 provides such an indication since it represents the changes which have to be made in the current in the winding 16 in order to cause the magnetomotive force produced by the current in the winding 16 to equal the magnetomotive force produced by the current in the winding 12. Since the signals in the register 67 are binary, the digital signals from the counter 60 or the register 67 of FIG. 1 can be transmitted at each instant to the central station to indicate the current in the winding 12.

Figure 7:
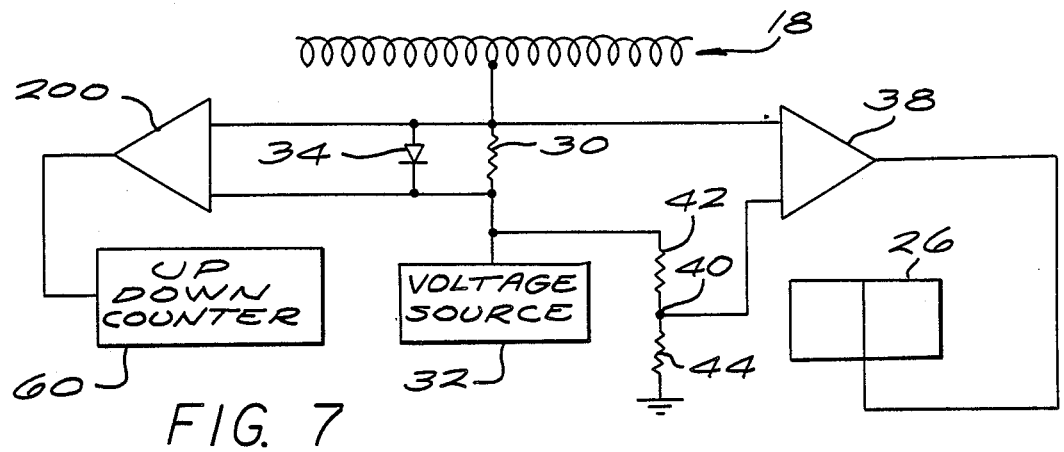
FIG. 7 is a schematic diagram illustrating another embodiment of the invention for enhancing the accuracy of determining at each instant the magnitude of the variable electrical current.

FIG. 7 illustrates another embodiment of the invention. This embodiment may be considered to have certain advantages over the embodiment shown in FIG. 1 because it measures the time between successive occurrences of a zero current in the resistance 30. This tends to enhance the sensitivity of the measurement in the digital counter 60 because the count in the counter tends to occur for time periods precisely defined in the successive switchings of the flip-flop 26 between the opposite states of operation.

In the embodiment shown in FIG. 7, a comparator 200 is provided in addition to the comparator 38 shown in FIG. 1. The two input terminals of this comparator 200 are connected to the opposite ends of the resistance 30. The output terminal of the comparator 200 is connected to the input terminal of the digital counter 60 in FIG. 1.

When the bistable flip-flop 26 triggers the switches 20 and 22 in FIG. 1 so that the current flows alternately in opposite directions through the winding 18, transients are produced in the windings 12 and 16. These transients occur because the winding 18 opposes any changes in the current in the winding. At some time after the generation of the transients, the voltage on the center tap of the winding 30 may equal the voltage from the source 32. At such a time, no current flows through the resistance 30. At such a time, the comparator 200 produces a signal which is introduced to the counter 60. This signal triggers the counter so that the counter counts in an opposite direction from its previous count.

The system shown in FIG. 7 may be considered to provide a more accurate measurement of the remanent magnetization in the core 14 than the embodiment shown in FIG. 1. This results from the operation of the counter 60 on the basis of null signals from the comparator 200. This causes the time difference to be greater for a particular error of magnetization than in the embodiment shown in FIG. 1. This reduces the susceptibility of the measurement to noise and reduces the error band of the tracking system.

FIG. 9 illustrates another embodiment of the invention 6. The embodiment shown in FIG. 9 includes a digital-to-analog converter 280 corresponding to the converter 66 in the embodiment of FIG. 1 The output from the converter 280 passes through a pair of windings 282 and 284 connected in series and having substantially identical characteristics. The winding 282 is magnetically coupled to a magnetizable member 286 such as a core disposed in a closed loop. The winding 284 is magnetically coupled to a magnetizable member 288 such as a core disposed in a closed loop. Each of the windings 282 and 284 may correspond to the winding 16 in the embodiment shown in FIG. 1. The magnetizable members 286 and 288 are respectively provided with substantially identical characteristics.

A winding 290 corresponding to the winding 18 in FIG. 1 may also be disposed on the magnetizable member 286. Similarly, a winding 292 corresponding to the winding 18 in FIG. 1 may be disposed on the magnetizable member 288. A winding 294 corresponding to the winding 12 in FIG. 1 extends through the core 286 in magnetically coupled relationship with the core. The winding 294 is in series with a winding 296 which is in magnetically coupled relationship with the core 288. The winding 296 may also correspond to the winding 12 in FIG. 1. The windings 290 and 292 preferably have substantially identical characteristics, as do the windings 294 and 296.

The windings 290 and 292 may be center tapped and may be connected to a resistance 298 corresponding to the resistance 30 in FIG. 1. The end terminals of the winding 290 are respectively connected to the collectors of transistors 300 and 302. The transistors 300 and 302 respectively correspond to the transistors 20 and 22 in FIG. 1. Connections are also made from the opposite terminals of the winding 292 to the collectors of the transistors 301 and 303. However, the connections to the transistors 321 and 323 are opposite to the connections the winding 290 to the collectors of the transistor 300 and 302.

The currents through the windings 294 and 296 respectively produce magnetic fluxes in the magnetizable members 286 and 288. As previously indicated, these fluxes are substantially identical. These fluxes induce equal voltages in the windings 290 and 292. Since the windings 290 and 292 produce substantially identical characteristics, the windings have substantially identical current flows, initially in one direction and then in the opposite direction. However, as will be seen, the windings 290 and 292 are connected oppositely to the transistor 300 and also to the transistor 302. Specifically, for example, the left end of the winding 290 is connected to the collector of the transistor 300 but the right end of the winding 292 is connected to the collector of the transistor.

Because of the opposite connections of the windings 290 and 292 to the transistors 300 and 301 and also to the transistor 302 and 303, any transients in the magnetomotive forces produced in the magnetizable members 286 and 288 by the alternating operation of a flip-flop 310 (corresponding to the flip-flop 26 in FIG. 1) are minimized. This results from the fact that the transients in the winding 290 have an opposite effect on the transistor 300 than the effect of the transients from the winding 292 on the transistor 301. Opposite transient effects are also produced by the windings 290 and 292 on the transistors 302 and 303. Since these transient effects are eliminated or substantially reduced by the opposed relationships of the windings 290 and 292, the comparator 38 in FIG. 1 (or the comparator 200 in FIG. 7) is able to introduce a signal with no, or at least minimal, transients to the flip-flop 310. This provides for an optimal operation of the systems shown in FIGS. 1 or 8 and described above.

Although the windings 290 and 292 are connected to provide opposite effects on the transistors 300 and 301 and the transistors 302 and 303, the windings 282 and 284 are connected to provide an additive effect. Thus, the signal from the digital-to-analog converter 280 (corresponding to the converter 66 in FIG. 1) is instrumental in adjusting the current through the windings 282 and 284 to provide an indication of the current flowing through the windings 294 and 296.

The system shown in FIG. 9 also has other advantages of some importance. This results from a minimization in the power to control a current sufficient to match the input current modified by the turns ratio between the windings 294 and 282. Adding turns to the winding 282 reduces the current output needed. Unfortunately, each additional turn on the winding 282 causes an increased voltage to be induced into the winding from the cycling flux produced in the core 288 by the alternating current in the winding 290. This can be many volts. The additional core 288 and the windings on this core cause the voltage induced in the winding 282 to be reduced because of the voltage induced in the series winding 284.

The embodiment shown in FIG. 10 is similar to the embodiment shown in FIG. 9. However, the embodiment shown in FIG. 10 does not include the winding 292. Furthermore, the characteristics of a core 318 (corresponding to the core 288 in FIG. 9) do not have to match the characteristics of the core 286. In the embodiment shown in FIG. 10, a winding 320 on the core 286 is in series with a winding 322 on the core 318. The winding 320 may have the same number of turns as the winding 322.

The electromotive force induced in the winding 320 at any instant is dependent upon the difference in the magnetomotive forces produced by the currents in the windings 294 and 296 at that instant. This electromotive force causes a current to flow through the circuit including the windings 320 and 322. As a result, an electromotive force is induced in the winding 322 with a magnitude substantially equal to the electomotive force induced in the winding 320. However, the polarity of the electromotive force induced in the winding 322 is opposite to the polarity of the electromotive force induced in the winding 320. As result, no net voltage is introduced into the input circuit including the windings 294 and 296 or into the circuit including the digital-to-analog converter 280 and the windings 282 and 284.

The system shown in FIG. 10 has all of the advantages of the system of FIG. 9 even though it may be considered to be simpler than the system of FIG. 9. For example, transients in the alternating operation of the flip-flop 310 are minimized. Furthermore, since the windings 282 and 284 are connected on an additive basis, the signal from the converter 280 is instrumental in adjusting the current through the windings 282 and 284 to provide an indication of the current flowing through the windings 294 and 296. The system shown in FIG. 10 minimizes the voltage induced in the winding 282 as in the embodiment shown in FIG. 9. The system shown in FIG. 10 is further advantageous in that the cores 286 and 318 do not have to have identical characteristics.

The embodiment shown in FIG. 11 provides an additional improvement in applicant's system. The embodiment shown in FIG. 11 is intended to enhance the operation of the system shown in FIG. 1 when the current to be fed back to the winding 16 exceeds the available feedback current from the digital-to-analog converter 66. Under such circumstances, the core 14 may tend to saturate so completely that the sensing winding 18 will have no effect. This will cause the tracking algorith to be lost at least until the core 14 can recover from such saturation. As a result, an error will be produced in the cumulative count in the register 67.

In the embodiment shown in FIG. 11, a core 350 corresponding to the core 14 in FIG. 1 is provided with a notch 352, preferably V-shaped. In the notched core 350, a relatively small neck 354 saturates first when the current to be fed back to the winding 16 exceeds the available feedback current from the digital-to-analog converter 66. However, the air gap 356 in the core is not saturated. As a result, an indication is provided of the direction of the current error. As the measured current in the winding 12 increases further, the region of saturation progresses into the air gap 356 but still provides for the indication of the direction of the error. This is true even for high currents in the winding 12.

The provision of the notch 352 in the core 350 offers other advantages. As described in the previous paragraph, all of the flux in the core 350 passes through the neck 354 until the neck becomes saturated. For currents less than that producing flux saturation in the neck 354, all of the flux passes through the neck without any flux saturation. Since the volume of magnetizable material in the neck 354 is small, the energy for driving the flux around the loop defined by the core 350 is small. This causes the time for the flux to traverse the loop to be reduced and the current for producing the flux to be reduced. This minimizes the power for driving the system and enhances the available rate of sampling the input current.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. Apparatus for determining a variable electrical current, including,
   a magnetizable member defining a closed flux path and having saturable characteristics,
   a first winding magnetically coupled to the magnetizable member for receiving the variable electrical current to produce at each instant a magnetic flux through the magnetizable member in accordance with the magnitude of the variable electrical current at that instant,
   a second winding magnetically coupled to the magnetizable member for producing a variable current at each instant to obtain the production at that instant of a magnetic flux in the magnetizable member with a polarity opposing the magnetic flux produced by the current through the first winding and a magnitude equal to that produced by the current through the first winding,
   the magnetizable member being responsive to any differences between the currents in the first and second windings to produce a remanent flux in the magnetizable member,
   means for alternately producing fluxes of a particular magnitude of opposite polarities,
   means responsive to the effect of the alternate production of the fluxes of the particular magnitude and opposite polarities in the magnetizable member at each instant for producing a digital signal representative of the remanent flux in the magnetizable member at that instant, and
   means responsive to the digital signal representative of such remanent flux for varying the magnitude of the current in the second winding in a direction to nullify the flux in the magnetizable member.

2. In a combination as set forth in claim 1,
   the digital signal means including a third winding magnetically coupled to the magnetizable member.

3. Apparatus for determining a variable electrical current, including,
   a first magnetizable member defining a closed flux path,
   a first winding magnetically coupled to the first magnetizable member for receiving the variable electrical current to produce at each instant a magnetic flux through the magnetizable member in accordance with the magnitude of the variable electrical current at that instant,
   a second winding magnetically coupled to the first magnetizable member for producing a variable current at each instant to obtain the production at that instant of a magnetic flux in the first magnetizable member with a polarity opposing the magnetic flux produced by the current through the first winding and a magnitude equal to that produced by the current through the first winding,
   first means responsive to the flux in the first magnetizable member at each instant for producing a digital signal, and
   second means for varying the magnitude of the current in the second winding in a direction to nullify the flux in the first magnetizable member,
   the second means including:
   a second magnetizable member,
   a first winding on the second magnetizable member for receiving the variable electrical current,
   a second winding on the second magnetizable member for stepping the variable electrical current down and for introducing the stepped-down current to the first winding on the first magnetizable member,
   a third winding on the first magnetizable member, and
   means for producing a current through the third winding on the first magnetizable member to obtain the production of a flux in the first magnetizable member with the same polarity as that produced by the current in the first winding on the first magnetizable member and with a magnitude to compensate for energy losses produced in the second magnetizable member by the current through the first winding on the second magnetizable member.

4. Apparatus for determining a variable electrical current, including,
   a magnetizable member defining a closed flux path, a first winding magnetically coupled to the magnetizable member for receiving the variable electrical current to produce at each instant a magnetic flux through the magnetizable member in accordance with the magnitude of the variable electrical current at that instant, a second winding magnetically coupled to the magnetizable member for producing a variable current at each instant to obtain the production at that instant of a magnetic flux in the magnetizable member with a polarity opposing the magnetic flux produced by the current through the first winding and a magnitude equal to that produced by the current through the first winding, means responsive to the flux in the magnetizable member at each instant for producing a digital signal, and means responsive to the digital signal for varying the magnitude of the current in the second winding in a direction to nullify the flux in the magnetizable member, the digital signal means including means for obtaining the production of the digital signal in accordance with the relative times between the periodic variation of the flux between the particular limit in one polarity and the periodic variation of the flux between the particular limit in the opposite polarity.

5. Apparatus for determining a variable electrical current, including, a magnetizable member defining a closed flux path, a first winding magnetically coupled to the magnetizable member for receiving the variable electrical current to produce at each instant a magnetic flux through the magnetizable member in accordance with the magnitude of the variable electrical current at that instant, a second winding magnetically coupled to the magnetizable member for producing a variable current at each instant to obtain the production at that instant of a magnetic flux in the magnetizable member with a polarity opposing the magnetic flux produced by the current through the first winding and a magnitude equal to that produced by the current through the first winding, means responsive to the flux in the magnetizable member at each instant for producing a digital signal, and means responsive to the digital signal for varying the magnitude of the current in the second winding in a direction to nullify the flux in the magnetizable member, the varying means including means for varying the rate at which the current is varied in the second winding, in accordance with the relative values of previous variations in such rate, to nullify the flux in the magnetizable member.

6. Apparatus for determining a variable electrical current, including, a magnetizable core providing for a flow of magnetizable flux in a closed loop, a first winding magnetically coupled to the core and providing an electrical current corresponding to the variable electrical current for producing a flux in the core in accordance with the magnitude and polarity of the variable electric current, a second winding magnetically coupled to the core for providing a flow of current in a direction to obtain the production in the core of flux opposing the flux produced in the core by the current in the first winding, a third winding magnetically coupled to the core, first means, including the third winding, responsive to the flux in the core at each instant for producing at such instant a digital signal representative of the polarity and magnitude of the flux in the core at that instant, and second means responsive to the digital signal produced by the first means at each instant for varying the current in the second winding in a direction to nullify the flux in the core at that instant.

7. Apparatus as set forth in claim 6, including, the magnetizable core constituting a first magnetizable core, a second magnetizable core disposed in a closed loop, a first winding on the second magnetizable core for receiving the variable electrical current, and a second winding on the second magnetizable core for reducing, by a particular ratio, the magnitude of current in the first winding on the second magnitizable core and for introducing the decreased current to the first winding on the first magnetizable core as the variable electrical current.

8. Apparatus as set forth in claim 7, including, means operatively coupled to the first magnetizable core for compensating for energy losses produced in the second magnetizable core by the flow of the variable electrical current through the first winding on the second magnetizable core.

9. Apparatus as set forth in claim 6, including, means responsive to the variations produced in the current in the second winding by the second means for controlling the rate of such current variations at each instant in accordance with the previous rate of such current variations produced in such current and in accordance with the effect of such previous rate of such current variations in nullifying the flux produced in the magnetizable core by the second winding at such instant.

10. Apparatus as set forth in claim 6, including, the digital means including means operative at a relatively high frequency for producing a flow of current through the third winding to sample the flux in the magnetizable member in each cycle of such relatively high frequency to produce in each such cycle the digital signal representative of the polarity and magnitude of the flux in the core at that instant, and the means for varying the current in the second winding being responsive to the digital signal produced in the signal-producing means in each cycle to vary the current in the second winding in such cycle in a direction to eliminate the flux in the core at that instant.

11. Apparatus for determining a variable electrical current, including, a magnetizable core disposed in a closed loop, a first winding magnetically coupled to the core to receive a current corresponding to the variable electrical current and to produce a magnetic flux in the core in accordance with the characteristics of such variable electrical current, a second winding magnetically coupled to the core to produce in the core a magnetic flux opposing the magnetic flux produced in the core by the first winding, a third winding magnetically coupled to the core, first means coupled to the third winding for producing an alternating current through the third winding to a particular magnitude in the opposite polarities of such current, second means responsive to any unbalance in the relative times for the current in the third winding to reach the particular magnitude of such current in the opposite polarities to produce a signal representative of any such unbalance, and third means responsive to the representative signal for varying the magnitude of current in the second winding in a direction to obtain a balance of the fluxes produced in the core by the first and second windings.

12. Apparatus as set forth in claim 11, including,
the magnetizable core constituting a first magnetizable core,
a second magnetizable core disposed in a closed loop,
a first winding disposed on the second magnetizable core for receiving the variable electrical current, and
a second winding disposed on the second magnetizable core for producing a current reduced by a particular ratio from the current in the first winding on the second magnetizable core, the first winding on the first magnetizable core being connected to the second winding on the second magnetizable core to receive the current in the second winding on the second magnetizable core as the variable electrical current in the first winding on the first magnetizable core.

13. Apparatus as set forth in claim 12, including,
fourth means responsive to the variable electrical current in the first winding on the first magnetizable core for compensating in the first magnetizable core for energy losses produced in the second magnetizable core by the flow of the variable electrical current through the first winding on the second magnetizable core.

14. Apparatus as set forth in claim 13, including,
the fourth means including a fourth winding magnetically coupled to the first magnetizable core, and
fifth means responsive to the variable electrical current in the first winding on the first magnetizable core for introducing to the fourth winding a current producing flux in the first magnetizable core in the same direction as that produced in the first magnetizable core by the current in the first winding on the first magnetizable core and constituting a particular percentage of the current in the first winding on the second magnetizable core to compensate for energy losses produced in the second magnetizable core by the flow of the variable electrical current through the first winding on the second magnetizable core.

15. Apparatus as set forth in claim 14, including,
the current through the second winding on first magnetizable core being variable,
means responsive to variations in the variable current in the second winding on the first magnetizable core at progressive instants of time for varying the rate of such variations in such current in accordance with the relative magnitudes of the variations in such current at such progressive instants of time.

16. Apparatus as set forth in claim 11, including,
a clock generator for generating clock signals,
a digital counter, and means responsive to the current in the third winding for introducing the clock signals to the digital counter in accordance with the flow of current of one polarity through the third winding to produce an incremental count in the counter and for introducing the clock signals to the counter in accordance with the flow of current of the opposite polarity through the third winding to produce a decremental count in the counter.

17. Apparatus for determining a variable electrical current, including,
a magnetizable core disposed in a closed loop,
a first winding magnetically coupled to the core and responsive to a current corresponding to the variable electrical current for producing a magnetic flux in the core in accordance with the magnitude of such variable electrical current,
a second winding magnetically coupled to the core for producing in the core a magnetic flux opposite to that produced in the core by the current in the first winding,
servo means operatively coupled to the core for testing the polarity and magnitude of the flux in the core through opposite polarities at a relatively high frequency to produce, in each cycle at the high frequency, a digital signal having characteristics representative of such magnitude and polarity, and
first means responsive to the characteristics of the digital signal at each instant of time for varying the magnitude of the current in the second winding at that instant of time in a direction to minimize the digital signal.

18. Apparatus as set forth in claim 17, including,
the servo means including a third winding magnetically coupled to the core and having a center tap to produce the flow of current respectively through the opposite halves of the third winding during the respective testing of the opposite polarities of the flux in the core at the high frequency and the servo means further including second means responsive to the effect produced on the currents in the opposite halves of the third winding by the flux in the core to provide the digital signal with characteristics representative of the difference in time between the flow of the currents in the opposite halves of the third winding.

19. Apparatus as set forth in claim 17, including,
the magnetizable core constituting a first magnetizable core,
a second magnetizable core disposed in a closed loop, and
second means operatively coupled to the second magnetizable core for decreasing the magnitude of the variable electrical current by a particular proportion and for introducing the current with the decreased magnitude to the first winding on the first magnetizable core as the variable electrical current.

20. Apparatus as set forth in claim 19, including,
third means including a third winding magnetically coupled to the first magnetizable core for producing in the third winding an electrical current to provide in the first magnetizable core a magnetic flux aiding the magnetic flux produced in the first magnetizable core by the first winding on the first magnetizable core and compensating for energy losses produced in the second core by the decrease in the magnitude of the variable electrical current by the second means.

21. Apparatus as set forth in claim 19, including,
a third winding magnetically coupled to the first magnetizable core, and
fourth means responsive to the variable electrical current in the first winding on the first magnetizable core for producing in the third winding a current having a magnitude constituting a particular percentage of the magnitude of the current produced in the first winding on the first magnetizable core and producing in the first magnetizable core a flux aiding that produced by the current in the first winding on the first magnetizable core to compensate for energy losses produced in the second magnetizable core as a result of the decrease in the magnitude of the variable electrical current by the second mean operatively coupled to the second magnetizable core.

22. Apparatus as set forth in claim 20, including,
a third winding on the second magnetizable core, the second and third windings being disposed on the second magnetizable core in a bifilar relationship and provided with substantially identical characteristics, the third winding on the second magnetizable core being operatively coupled to the third winding on the first magnetizable core.

23. Apparatus as set forth in claim 17, including,
the servo means including:
a third winding on the magnetizable core,
a digital counter,
a clock generator for generating clock signals,
means operatively coupled to the third winding on the magnetizable core for producing a flow of current in opposite directions through the third winding for time periods dependent upon any remanent flux in the magnetizable core and until the current in the third winding reaches a particular magnitude, and
means operatively coupled to the clock generator and the digital counter and responsive to the relative time periods for the flow of current of the opposite polarities in the third winding for producing in the counter a count of clock signals indicative of the remanent flux in the core.

24. Apparatus as set forth in claim 23, including,
the third winding being center tapped,
first switching means connected to one end of the third winding and having open and closed states,
second switching means connected to the other end of the third winding and having open and closed states, and
bistable means operatively coupled to the center tap of the third winding and the first and second switching means for obtaining a closure of one of the switching means and an opening of the other switching means during the time between the flow of current in the third winding of one polarity with the particular magnitude and the flow of current of the opposite polarity with the particular magnitude and for obtaining a closure of the other switching means and an opening of the one switching means during the time between the flow of current in the third winding of the opposite polarity with the particular magnitude and the flow of current of the one polarity with the particular magnitude.

25. Apparatus as set forth in claim 24, including, the first, second, third and fourth means having electrical and magnetic characteristics.

26. Apparatus as set forth in claim 25, including,
the third means being operative periodically at a relatively high frequency for adjusting the second excitation in the second magnetizable member in each cycle at such relatively high frequency to provide the second excitation in the second magnetizable member at the same magnitude as, and with an opposite polarity to, the first excitation in the second magnetizable member.

27. Apparatus as set forth in claim 26, including,
the third means including means responsive to the relative magnitudes of the progressive adjustments in the second excitation in the second magnetizable member in successive cycles at the relatively high frequency to control the rate at which adjustments are made by the third means in the second excitation in the second magnetizable member in the next cycles at the relatively high frequency.

28. Apparatus for determining a variable electrical current, including,
a first magnetizable member,
means associated magnetically with the first magnetizable member for stepping down the variable electrical current by a particular magnitude,
the first magnetizable member providing energy losses dependent upon the variable electrical current,
a second magnetizable member,
first means for providing in the second magnetizable member a first excitation indicative of the stepped-down variable electrical current,
second means for providing in the second magnetizable member a second excitation opposite to the excitation from the first means,
third means responsive at each instant to any difference between the first and second excitations in the second magnetizable member at such instant for adjusting the second excitation in the second magnetizable member at that instant to provide the second excitation in the second magnetizable member at the same magnitude as, and with an opposite polarity to, the first excitation in the second magnetizable member at that instant, and
fourth means for adjusting the excitation in the second magnetizable member to compensate for the energy losses produced in the first magnetizable member by the variable electrical current.

29. Apparatus as set forth in claim 28, including,
the third means including a clock generator for generating clock signals and a digital counter for producing in the digital counter a count of the clock signals in representation at each instant of any difference between the first and second excitations in the second magnetizable member at that instant, and
the third means being responsive to the count in the digital counter at each instant for adjusting the second excitation in the second magnetizable member at such instant to provide the second excitation in the second magnetizable member at the same magnitude as, and with an opposite polarity to, the first excitation in the second magnetizable member at that instant.

30. Apparatus for determining a variable electrical current, including,
a magnetizable member, first means responsive to a current corresponding to the variable electrical current for producing at each instant in the magnetizable member an excitation indicative of such electrical current at that instant, second means for producing at each instant in the magnetizable member a second excitation opposing the first excitation, third means responsive to the differences between the first and second excitations in the magnetizable member at each instant for adjusting the second excitation in the magnetizable member at that instant to eliminate any such differences in the excitations in the magnetizable member at that instant, fourth means responsive to the relative magnitudes of progressive adjustments made in the second excitation in the magnetizable member at each instant for determining the rate at which successive adjustments are made in such second excitation in the magnetizable member at that instant, and fifth means responsive to the adjustment rate determined at each instant by the fourth means for adjusting at each instant the rate at which the third means adjusts the second excitation in the magnetizabe member to eliminate any differences in the excitations produced in the magnetizable member at that instant by the first means and the second means.

31. Apparatus as set forth in claim 30, including,
the first and second means respectively including first and second windings magnetically coupled to the magnetizable member and the third means including fifth means fof providing digital indications of the differences between the first and second excitations in the magnetizable member at each instant and for responding to such digital indications to adjust the second excitation in the magnetizable member to eliminate any such differences.

32. Apparatus as set forth in claim 30, including,
the third means including sixth means for sampling the difference between the first and second excitations in the magnetizable member at a particular frequency to determine such difference in each cycle at the particular frequency, and the fourth means including seventh means responsive to the relative magnitudes and polarities of the adjustments made in the second excitation in the magnetizable member in the progressive cycles at the particular frequency for adjusting the rate at which adjustments are made in such second excitation in the next cycles at the particular frequency.

33. Apparatus as set forth in claim 31, including,
means for decreasing the magnitude of the variable electrical current by a particular porportion and for introducing the current of decreased magnitude to the first means, and means operatively coupled to the magnetizable member for producing an additional excitation in the magnetizable member in the same direction as the excitation produced by the first means in the magnetizable member to compensate for energy losses produced in the last mentioned means as a result of the operation of the decreasing means in decreasing the magnitude of the variable electrical current.

34. Apparatus for determining a variable electrical current, including,
a magnetizable member disposed in a closed loop, a first winding disposed in magnetically coupled relationship to the magnetizable member to produce in the magnetizable member a first excitation representative of the variable electrical current, a second winding disposed in magnetically coupled relationship to the magnetizable member to produce an excitation in the magnetizable member in a direction opposite to the first excitation, first and second switching means each having opened and closed states of operation, bistable means having first and second states of operation and operatively coupled to the first and switching means to obtain a closure of the first switching means in the first state of operation and a closure of the second switching means in the second state of operation, a third winding disposed in magnetically coupled relationship to the magnetizable member and having a center tap and a pair of end terminals each connected to an individual one of the first and second switching means, first means connected in electrical circuitry with the first and second switching means to produce a flow of current through the third winding and the individual ones of the switching means in the closed state of operation of such switching means, second means responsive to the production of a particular voltage in the first means by the flow of current in the third winding for triggering the bistable means from each state of operation to the other, third means for digitally detecting any unbalance in the time of operation of the bistable means in each cycle of operation of the bistable means in the first and second states, and fourth means responsive to the digital detection of any unbalance by the third means for adjusting the excitation produced in the magnetizable member by the second winding in a direction to minimize any differences between the times of closure of the first and second switching means.

35. Apparatus as set forth in claim 34, including,
fifth means for decreasing the magnitude of the variable electrical current by a particular proportion, the first winding being responsive to the decreased magnitude of the variable electrical current to produce the first excitation in the magnetizable member, a third winding disposed in magnetically coupled relationship to the magnetizable member, and sixth means operatively coupled to the third winding for producing an excitation in the magnetizable member in the same direction as the first excitation and with a magnitude to compensate for energy losses produced in the operation of the fifth means in decreasing the magnitude of the variable electrical current.

36. Apparatus as set forth in claim 35, including,
the sixth means including
a second magnetizable member disposed in a closed loop, fourth, fifth and sixth windings, the fourth winding being wound on the second magnetizable member and being connected to produce a flux in the second magnetizable member in accordance with the characteristics of the variable electrical current, the fifth and sixth windings being wound on the second magnetizable member in a bifilar relationship, means for connecting the first and fifth windings to obtain the production of the first excitation by the first winding in the first magnetizable member in accordance with the excitation produced in the second magnetizable member by the fourth winding, and means for connecting the third and sixth windings to obtain the production of the compensating excitation in the first magnetizable member by the sixth winding in accordance with the excitation produced in the second magnetizable member by the fourth winding.

37. Apparatus as set forth in claim 36, including, a third magnetizable member disposed in a closed loop and having the same magnetizable properties as the second magnetizable member, a seventh winding disposed on the third magnetizable member, the seventh winding having substantially the same characteristics as the sixth winding and being connected to the third winding, and means for amplifying the signal from the sixth winding in a particular proportion and for introducing such amplified signal to the seventh winding.

38. Apparatus as set forth in claim 34, including, means for adjusting the rate of adjustment produced at each instant by the fourth means in the excitation of the second winding in accordance with the relative rates of adjustment produced at the immediately previous instants by the fourth means in the excitation of the second winding.

39. Apparatus for determining a variable electrical current, including, a first magnetizable member defining a closed flux path, a first winding magnetically coupled to the first magnetizable member and connected to receive a current corresponding to the variable electrical current to produce a flux in the member in accordance with the characteristics of the electrical current, a second winding magnetically coupled to the first magnetizable member and having a number of turns higher by a particular magnitude than the number of turns in the first winding, a second magnetizable member defining a closed flux path, a third winding magnetically coupled to the second magnetizable member and connected to the second winding to receive the current flowing through the second winding and to produce flux in the second magnetizable member in accordance with such flow of current, a fourth winding magnetically coupled to the second magnetizable member to produce flux in an opposite direction in the second magnetizable member from that produced by the third winding, and means responsive to any differences in the fluxes produced in the second magnetizable member by the third and fourth windings for adjusting the current in the fourth winding in a direction to eliminate any such flux differences.

40. Apparatus as set forth in claim 39, including, a clock generator for generating clock signals, and a digital counter, the adjusting means including the clock generator and the digital counter and means responsive to any difference in the fluxes produced in the second magnetizable member by the third and fourth windings for providing in the digital counter a count of the clock signals representative of such flux difference.

41. Apparatus as set forth in claim 40, including, a fifth winding magnetically coupled to the second magnetizable member, means for producing a flow of current in opposite directions through the fifth winding to a particular magnitude in the opposite directions, means responsive to the flow of current through the fifth winding in the opposite directions to increment the count of the clock signals in the counter in accordance with the flow of current through the fifth winding in one direction and to decrement the count of the clock signals in the counter in accordance with the flow of current through the fifth winding in the opposite direction, and means responsive to the count in the counter for adjusting the current in the fourth winding, in accordance with such count, in a direction to minimize the count in the counter.

42. Apparatus as set forth in claim 41, including, first and second switching means each having open and closed states, the first and second switching means being respectively connected to the fifth winding to control the flow of current through the fifth winding in the opposite states in accordance with the pattern of openings and closings of the first and second switching means, and bistable means operatively coupled to the first and second switching means to provide alternately for the opening of the first switching means and the closure of the second switching means and for the closure of the first switching means and the opening of the second switching means in accordance with the flows of current of a particular magnitude and of opposite polarities through the fifth winding.

43. Apparatus as recited in claim 39, including, a fifth winding magnetically coupled to the first magnetizable member, the second winding being wound in a bifilar relationship with the fifth winding, and means including a sixth winding magnetically coupled to the second magnetizable member and associated with the fifth winding for producing flux in the second magnetizable member in a direction to compensate for energy losses produced in the first magnetizable member by the flow of current through the first winding.

44. Apparatus as set forth in claim 39, including, the adjusting means including a fifth winding magnetically coupled to the second magnetizable member and also including bistable means operative at a particular frequency to produce a flow of current in opposite directions through the fifth winding to a particular magnitude and further including digital counter means responsive to the current through the fifth winding for incrementing counts in the digital counter means in accordance with the flow of current of one polarity through the fifth winding and for decrementing the counts in the digital counter means in accordance with the flow of current of the opposite polarity through the fifth winding and further including means responsive to the count in the digital counter means for comparing the count in the digital counter means in the successive cycles of operation of the bistable means to adjust the rate of changes in the current in the fourth winding in the next cycles of operation of the bistable means in accordance with the results of such comparison.

45. Apparatus for determining a variable electrical current, including, a magnetizable member disposed in a closed loop, a first winding magnetically coupled to the magnetizable member to receive a current having characteristics corresponding to those of the variable electrical current and to produce a magnetic flux in a first direction in the member in accordance with the variations in such current, a second winding magnetically coupled to the magnetizable member to produce a magnetic flux in the member in an opposite direction to that produced by the first winding, a third winding magnetically coupled to the magnetizable member, means including the third winding for alternately producing a flow of current through the third winding in opposite polarities to a particular magnitude, means responsive to the times of occurrence of a zero magnitude of current in the flow of current of the opposite polarities through the third winding for producing signals representing the relative times of occurrence of such zero magnitudes of the current, and means responsive to the relative times of occurrence of such currents of zero magnitude in the third winding for adjusting the magnitude of the current in the second winding to nullify the flux produced in the magnetizable member by the first winding.

46. Apparatus as set forth in claim 45, including, the adjusting means including:

a clock generator for generating clock signals, a digital counter, means including the clock generator and the digital counter for incrementing a count of the clock signals in the counter during the time until the occurrence of a first zero magnitude of current in the third winding by a flow of current of one polarity in the third winding and for decrementing the count in the counter until the time of occurrence of a second zero magnitude of current in the third winding by a flow of current of the opposite polarity in the third winding, and the adjusting means being responsive to the digital count in the counter for adjusting the magnitude of the current in the second winding in a direction to nullify the flux produced in the magnetizable member by the first winding.

47. Apparatus as set forth in claim 46, including, means responsive to the count in the digital counter in each alternation of the flow of current of opposite polarities in the third winding for comparing such count with the count in the digital counter in the previous alternation, and means responsive to each such comparison for producing controlled rates of adjustments in the magnitude of the current in the second winding in a direction to nullify the flux produced in the magnetizable member by the current in the second winding.

48. Apparatus as set forth in claim 44, including, means for receiving the variable electrical current and for stepping down the variable electrical current by a particular factor for introduction to the first winding on the magnetizable member, and means including a fourth winding magnetically coupled to the magnetizable member for producing a current in the fourth winding to obtain the production of a flux in the magnetizable member in the same direction as that produced in the magnetizable member by the current in the first winding and with a magnitude to compensate for any energy losses produced in the stepping-down means.

49. Apparatus as set forth in claim 45, including, a second magnetizable member disposed in a closed loop, a fourth winding magnetically coupled to the second magnetizable member for receiving the variable electrical current, and a fifth winding having a greater number of turns by a particular factor than the fourth winding and magnetically coupled to the second magnetizable member and connected to the first winding to introduce to the first winding a current having characteristics corresponding to, but less by the particular factor than, the current introduced to the fourth winding.

50. Apparatus for determining a variable electrical current, including, a magnetizable member disposed in a closed loop, a first winding magnetically coupled to the magnetizable member to receive a current variable in accordance with the variations in the variable electrical current and to produce in the magnetizable member a flux related to such current, a second winding magnetically coupled to the magnetizable member to produce a flux in the magnetizable member in an opposite direction to that produced by the current in the first winding, a third winding magnetically coupled to the magnetizable member, the third winding being center tapped, bistable means having first and second stages of operation, one of the stages being connected between the center tap and one end terminal of the third winding and the other stage being connected between the center tap and the other end terminal of the third winding, means including the bistable stage for alternately producing a flow of current to a particular magnitude in one direction between the center tap and one end terminal of the third winding and in an opposite direction between the center tap and the other end terminal of the third winding, means responsive to the flow of current in the opposite directions in the third winding for producing a digital count in one direction of the time for the flow of such current in one direction to the particular magnitude and for producing a digital count in the opposite direction of the time for the flow of such current in the opposite direction to the particular magnitude, and means responsive to the count in the digital counter in each cycle of operation of the bistable means for adjusting the polarity and magnitude of the current in the second winding to obtain the production by the second winding of flux nullifying in the magnetizable member the flux produced in the magnetizable member by the current in the first winding.

51. Apparatus as set forth in claim 50, including, the magnetizable member constituting a first magnetizable member, a second magnetizable member disposed in a closed loop, a fourth winding magnetically coupled to the second magnetizable member for receiving the variable electrical current and for producing in the second magnetizable member a flux in accordance with the variations in such current, and a fifth winding magnetically coupled to the second magnetizable member and having a greater number of turns by a particular factor than the fourth winding and connected to the first winding to produce a flow of current, less by a particular proportion than the magnitude of the variable electrical current, through the first winding for the production of the flux in the first magnetizable member by the first winding.

52. Apparatus for determining a variable electrical current, including, a magnetizable member disposed in a closed loop, a first winding magnetically coupled to the magnetizable member to receive a current variable in accordance with the variations in the variable electrical current and to produce in the magnetizable member a flux related to such current, a second winding magnetically coupled to the magnetizable member to produce a flux in the magnetizable member in an opposite direction to that produced by the current in the first winding, a third winding magnetically coupled to the magnetizable member, the third winding being center tapped, bisable means having first and second stages of operation, one of the stages being connected between the center tap and one end terminal of the third winding and the other stage being connected between the center tap and the other end terminal of the third winding, means including thye bisable stage for alternately producing a flow of current to a particular magnitude in one direction between the center tap and one end terminal of the third winding and in an opposite direction between the center tap and the other end terminal of the third winding, means responsive to the flow of current in the opposite direction in the third winding for producing a digital count in one direction of the time for the flow of such current in one direction to the particular magnitude and for producing a digital count in the opposite direction of the time for the flow of such current in the opposite direction to the particular magnitude, and means responsive to the count in the digital counter in each cycle of operation of the bistable means for adjusting the polarity and magnitude of the current in the second winding to obtain the production by the second winding flux produced in the magnetizable member by the current in the first winding, the magnetizable member constituting a first magnetizable member, a second magnetizable member disposed in a closed loop, a fourth winding magnetically coupled to the second magnetizable member for receiving the variable electrical current and for producing in the second magnetizable member a flux in accordance with the variations in such current, a fifth winding magnetically coupled to the second magnetizable member and having a greater number of turns by a particular proportion than the fourth winding and connected to the first winding to produce a flow of current through the first winding for the production of the flux in the first magnetizable member by the first winding, a sixth winding magnetically coupled to the second magnetizable member in a bifilar relationship with the fifth winding, a seventh winding magnetically coupled to the first magnetizable member, and means including the sixth winding and the seventh winding for producing in the seventh winding a flow of current in a direction and with a magnitude to compensate, in the production of flux in the first magnetizable member by the current in the second winding, for energy losses produced in the second magnetizable member by the flow of the variable electrical current in the fourth winding.

53. Apparatus for determining a variable electrical current, including, a magnetizable member disposed in a closed loop and having saturable magnetic characteristics, means including a first winding magnetically coupled to the magnetizable member for producing an excitation in a first direction in the magnetizable member corresponding to the variable electrical current, means including a second winding magnetically coupled to the magnetizable member for producing an excitation in the magnetizable member in a second direction opposite to the first direction, and means responsive at each instant to the differences in the excitations produced by the first and second windings in the magnetizable member at that instant for varying the excitation produced by the second winding in the magnetizable member to equal the excitation produced by the first winding in the magnetizable member, the magnetizable member being notched to limit any saturation in the magnetizable member.

54. Apparatus as set forth in claim 53, including the notch in the magnetizable member being V-shaped.

55. Apparatus as set forth in claim 53, including, means associated with the magnetizable member for providing for the determination of large magnitudes in the variable electrical current without saturating the magnetizable member.

56. Apparatus as set forth in claim 53, including, the excitation-varying means including means for providing a digital count representative at each instant of the difference between the excitations produced in the magnetizable member by the first and second windings at that instant and further including means responsive at each instant to the digital count for varying the excitation produced by the second winding in the magnetizable member at that instant in a direction to minimize the digital count.

57. Apparatus as set forth in claim 56, including, the notches in the magnetizable member being V-shaped, means associated with the magnetizable member for providing for the determination of large magnitudes in the variable electrical current without saturating the magnetizable member, and means for adaptively tracking the variations produced by the excitation-varying means in the excitation from the second winding to facilitate the variations in such excitations in obtaining substantially equal excitations in the magnetizable member from the first and second windings.

58. Apparatus as set forth in claim 53, including,
means for adaptively tracking the variations produced by the excitation-varying means in the excitation from the second winding to facilitate the variations in such excitations in obtaining substantially equal excitations in the magnetizable member from the first and second windings.

59. Apparatus for determining a variable electrical current, including,
a magnetizable member disposed in a closed loop,
means including a first winding magnetically coupled to the magnetizable member for providing for the flow of the variable electrical current to the magnetizable member through the first wonding and for producing a first magnetomotive force in the magnetizable member in accordance such the variable electrical current,
means including a second winding magnetically coupled to the magnetizable member for producing a flow of a second current through the seconding winding and for producing a second magnetomotive force in the magnetizable member in a direction opposite to the first magnetomotive force, the second winding having a higher number of turns than the first winding,
means for determining the difference between the first and second magnetomotive forces in the magnetizable member at each instant,
means associated with the second winding means for adjusting the second magnetomotive force at each instant to produce an equality between the first and second magnetomotive forces at that instant, and
means associated with the second winding means for minimizing the number of turns in the second winding relative to the number of turns in the first winding while minimizing the flow of the second current through the second winding.

60. Apparatus as set forth in claim 59, including,
the minimizing means including a second magnetizable member disposed in a closed loop and means including a third winding magnetically coupled to the first magnetizable member and a fourth winding magnetically coupled to the second magnetizable member and connected to the third winding to minimize the number of turns in the second winding relative to the number of turns in the first winding while minimizing the flow of the second current through the second winding.

61. Apparatus as set forth in claim 60, including, the third and fourth windings being connected.

62. Apparatus as set forth in claim 59, including,
the adjusting means including a third winding magnetically coupled to the magnetizable member and means associated with the third winding for alternately producing a flow of current in one direction through the third winding to saturate the magnetizable member to a particular level and for alternately producing a flow of current in the opposite direction through the third winding to saturate the magnetizable member to the particular level and means for digitally indicating the difference in the times for producing the alternate saturations in the magnetizable member to the particular level, an the adjusting means being responsive to the digital count at each instant for adjusting the second magnetomotive force at such instant to produce an equality between the first and second magnetomotive forces at that instant.

63. Apparatus as set forth in claim 62, including,
the minimizing means including a second magnetizable member disposed in a closed loop and means including a fourth winding magnetically coupled to the second magnetizable member and connected to the first winding and means including a fifth winding magnetically coupled to the second magnetizable member and connected to the second winding and means including a sixth winding magnetically coupled to the second magnetizable member and connected to the third winding.

64. Apparatus as set forth in claim 63, including,
the first and fourth windings being connected in the same direction, the second and fifth windings being connected in the same direction and the third and sixth windings being connected in opposite directions.

65. Apparatus for determining a variable electrical current, including,
a magnetizable member disposed in a closed loop,
a first winding magnetically coupled to the magnetizable member for receiving a variable current related to the variable electrical current and for producing a magnetomotive force in accordance with such variable current,
a second winding magnetically coupled to the magnetizable member for producing a magnetomotive force in the magnetizable member in a direction opposite to that produced by the first winding,
means for alternately saturating the magnetizable member to a particular level in opposite directions,
means for providing a digital indication of the difference in the times for alternately saturating the magnetizable member to the particular level in the opposite directions,
means for adjusting the magnetomotive force provided by the second winding in a direction to maintain the first and second magnetomotive forces substantially equal, and
means for minimizing any transients in the magnetizable member when the direction of producing the magnetomotive force in the magnetizable member is reversed.

66. Apparatus as set forth in claim 65, including,
the means for minimizing transients including a second magnetizable member disposed in a closed loop and fourth, fifth and sixth windings magnetically coupled to the second magnetizable member and respectively corresponding to the first, second and third magnetizable members, the first and fourth windings being connected in the same direction, the second and fifth windings being connected in the same direction and the third and sixth windings being connected in opposite directions.

67. Apparatus as set forth in claim 66, including,
a second magnetizable member disposed in a closed loop,
a third winding magnetically coupled to the second magnetizable member for receiving the variable electrical current, and
a fourth winding magnetically coupled to the second magnetizable member for stepping down the current in the third winding and for introducing such stepped-down current to the first winding.

68. A method of determining a variable electrical current, including the steps of:
providing a magnetizable member having a closed loop,
producing in the magnetizable member a first magnetic flux having at each instant a magnitude representative of the magnitude of the variable electrical current at that instant,
providing at each instant an electrical current to obtain the production in the magnetizable member of a second magnetic flux opposing the magnetic flux representative of the electrical current,
alternately producing in the magnetizable member magnetic flux of a particular magnitude and of first and second opposite polarities,
digitally determining at each instant the difference between the time for the production in the magnetizable member of the flux of the particular magnitude and the first polarity and the production in the magnetizable member of the flux of the particular magnitude and the second polarity,
adjusting at each instant the electrical current producing the second magnetic flux in accordance with the digital determinations to provide an equality in the magnetizable member between the first magnetic flux and the second magnetic flux at that instant, and
determining at each instant the electrical current producing the second magnetic flux.

69. A method as set forth in claim 70, including the steps of:
decreasing the magnitude of the variable electrical current,
using the decreased magnitude of the variable electrical current to obtain the production of the first magnetizable flux in the magnetizable member.

70. A method as set forth in claim 69, including the steps of:
producing in the magnetizable member an additional magnetic flux in the same direction as the first magnetic flux and with a magnitude compensating for energy losses incurred in the step of decreasing the magnitude of the variable electrical current.

71. A method as set forth in claim 68, including the step of:
determining the magnitude of each adjustment in the electrical current producing the second magnetic flux, and varying the magnitude of each successive adjustment in such electrical current in accordance with the determination of the previous adjustment in such electrical current.

72. A method of determining a variable electrical current including the steps of:
providing a first magnetizable member having a closed loop,
introducing the variable electrical current to a first winding magnetically coupled to the first magnetizable member,
providing a second magnetizable member having a closed loop,
providing a second winding in magnetically coupled relationship to the first magnetizable member with a greater number of turns by a particular factor than the number of turns in the first magnetizable member,
introducing the current from the second winding to a third winding magnetically coupled to the second magnetizable member to obtain the production of a first magnetic flux in the second magnetizable member,
providing at each instant an electrical current to obtain the production in the second magnetizable member of a second magnetic flux opposing the first magnetic flux,
producing digital indications representing at each instant any difference between the first and second magnetic fluxes,
adjusting at each instant the characteristics of the electrical current producing the second magnetic flux in a direction to reduce the magnitude represented by the digital indications, and
determining at each instant the magnitude of the current producing the second magnetic flux in the second magnetizable number.

73. A method as set forth in claim 72, including the step of:
producing an additional flux in the second magnetizable member in the same direction as the first magnetic flux and with a magnitude to compensate for energy losses produced in the first magnetizable member by the flow of the variable electrical current through the first winding.

74. A method as set forth in claim 72, including the step of:
comparing the adjustments made in immediately preceding instants in the electrical current producing the second magnetic flux in the second magnetizable member, and
adjusting at each instant the variation in the electrical current producing the second magnetic flux in the second magnetizable member in accordance with the comparisons in such adjustments in the immediately preceding instants.

* * * * *